United States Patent
Chen

(10) Patent No.: US 7,873,089 B2
(45) Date of Patent: Jan. 18, 2011

(54) DISTRIBUTED FEEDBACK SEMICONDUCTOR LASER BASED ON RECONSTRUCTION-EQUIVALENT-CHIRP TECHNOLOGY AND THE MANUFACTURE METHOD OF THE SAME

(75) Inventor: Xiangfei Chen, Jiangsu (CN)

(73) Assignee: Nanjing University, Nanjing, Jiangsu (CN)

( * ) Notice: Subject to any disclaimer, the term of this patent is extended or adjusted under 35 U.S.C. 154(b) by 173 days.

(21) Appl. No.: 12/281,765

(22) PCT Filed: Feb. 25, 2007

(86) PCT No.: PCT/CN2007/000601
§ 371 (c)(1),
(2), (4) Date: Sep. 4, 2008

(87) PCT Pub. No.: WO2007/101394
PCT Pub. Date: Sep. 13, 2007

(65) Prior Publication Data
US 2009/0010295 A1 Jan. 8, 2009

(30) Foreign Application Priority Data
Mar. 9, 2006 (CN) .................... 2006 1 0038728

(51) Int. Cl.
*H01S 3/08* (2006.01)
*H01S 5/00* (2006.01)
(52) U.S. Cl. .................. 372/50.11; 372/96; 372/102
(58) Field of Classification Search ............. 372/50.11, 372/96, 102
See application file for complete search history.

(56) References Cited

U.S. PATENT DOCUMENTS

| 2002/0181518 A1* | 12/2002 | Mizutani ............ 372/27 |
| 2004/0131099 A1* | 7/2004 | Thiyagarajan ........ 372/45 |
| 2005/0123018 A1* | 6/2005 | Takagi et al. ........ 372/96 |

* cited by examiner

*Primary Examiner*—Armando Rodriguez
(74) *Attorney, Agent, or Firm*—Global IP Services; Tianhua Gu

(57) ABSTRACT

Using sampled Bragg grating structure, the present invention proposes a distributed feedback (DFB) semiconductor laser based on reconstruction-equivalent-chirp technology. Namely, the Bragg grating in the said DFB semiconductor laser cavity is a sampled Bragg grating, in which there is an equivalent grating corresponding to the original ordinary DFB grating as feedback for lasing. The laser wavelength of the said semiconductor laser located within the operation bandwidth of the said equivalent grating. The said equivalent grating is designed and fabricated using REC technology and has equivalent chirps, one equivalent phase shift or multiple equivalent phase shifts. The said sampled Bragg grating has multiple ghost gratings and the wavelength spacing between neighboring ghost gratings is inversely proportional to the sampling period and the effective refractive index of the said semiconductor laser. Only one ghost grating except the ghost grating related to the center wavelength is selected to be as equivalent grating. In semiconductor laser fields, only based on sub-micron precision, the present invention provides a method to realize various complex equivalent chirps and equivalent phase shifts in the resonant cavity of the said semiconductor laser. These equivalent chirps and equivalent phase shifts have the same functions with the corresponding true chirps and true phase shifts, so as to avoid the processes of fabrication of grating structure with complex true chirps and true phase shifts.

18 Claims, 3 Drawing Sheets

DISTRIBUTED FEEDBACK SEMICONDUCTOR LASER BASED ON RECONSTRUCTION-EQUIVALENT-CHIRP TECHNOLOGY AND THE MANUFACTURE METHOD OF THE SAME

FIELD OF THE INVENTION

The present invention relates to a distributed feedback (DFB) laser, particularly the design and manufacture of complex DFB lasers based on reconstruction-equivalent-chirp technology. This invention improves DFB lasers for optical communication system.

BACKGROUND OF THE INVENTION

Around the globe, the increasing need for bandwidth and the pursuit for realizing FTTH (Fiber to the Home) speedup the global fiber industry. At the same time, they have accelerated the development of the semiconductor laser industry in the field of optical communication. With the increasing popularity and the development of broadband network, the demands for bandwidth continue to grow surprisingly. For instance, the annual growth rate of the network users is over 50%, meantime the annual growth rate of household users reach 300%. Nowadays the most low-cost and the most effective way to expand the bandwidth is to use dense-wavelength-division-multiplexing (DWDM) optical transmission system, which drives the growth of demand for semiconductor lasers explosively. As the light source, semiconductor lasers are the key component in the fiber-optic system. Generally, single mode semiconductor lasers have been widely used in fiber optic communication, and their quality is a decisive factor for the transmission performance of optical communications. Usually, high quality semiconductor lasers perform well in single-longitude-mode characteristic, which has good mono-chromaticity without mode jump. In order to guarantee the single longitude mode operation dynamically, one of the most effective ways is to form a Bragg gratings in the semiconductor laser waveguide to select a wavelength longitude mode for lasing. Such type of laser with Bragg grating in the laser cavity is called distribute feedback (DFB) semiconductor laser. The feature of DFB laser is that the grating structure is distributed in the whole resonant cavity so that the light can be amplified during the feedback. Benefiting from the apparent wavelength selection of the DFB semiconductor laser's resonant cavity, the mono-chromaticity of this kind of laser is superior to other normal semiconductor lasers. Generally DFB semiconductor lasers are index-coupling induced by the periodic change in the reflecting index. When the reflection at the front and rare facets of the laser is zero, theoretical analysis shows that in this ideal condition, there are two degenerate modes with the same lowest resonant cavity loss that are symmetrical around the Bragg wavelength in index coupling DFB semiconductor laser.

Meanwhile there is only one mode with the lowest resonant cavity loss that is exactly at the Bragg wavelength in gain coupling DFB semiconductor laser. Therefore, there are two longitude modes in the index-coupling DFB lasers theoretically.

For the practical DFB semiconductor lasers, there are always some reflections in both facets of the laser. Not only is the reflectivity not equal to zero, but the reflection phase is also uncertain. This is due to the fact that in the practical fabrication of devices, the position of the facets in the grating periods is uncontrollable. For the pure refractive index coupling DFB semiconductor lasers, in a considerable number of phases, the mode degeneracy is eliminated and single-longitude-mode operation is achieved. This was the method by which the single longitude mode operation was achieved in the earlier index-coupling DFB semiconductor lasers. But the random reflection phase leads to low single mode yield, which is about 20%~50% when the facets have no anti-reflection coating. Usually, the coating on the facets influences the single mode yield. When one facet is coated with low reflection film and the other facet is coated with high reflection film, the single model yield reaches 50%. Lasers prepared using this method has a side mode suppression ratio (SMSR) of bigger than 40 dB when working statically; however, under high speed modulation, the SMSR is smaller than 20 dB, which cannot meet the requirement of high speed optical communications. A solution for such a problem is to introduce a quarter-wavelength ($\lambda/4$) phase shift in the center of the DFB grating to eliminate the mode degeneracy and realize single longitude model operation. The biggest advantage of this method is that true dynamic single longitude mode operation is realized by the giant gap between the fundamental mode and the high-order modes [S. Akiba, M. Usami and K. Utaka, "1.5-m $\lambda/4$-shifted InGaAsP/InP DFB lasers (1.5-m $\lambda/4$ phase-shift InGaAsP/InP DFB laser), J. Lightwave Technol. Vol. 5th, pp. 1564-1573, November 1987].

$\lambda/4$ DFB semiconductor lasers could be used as direct-modulated lasers. The biggest merit of direct-modulated DFB semiconductor lasers is that the dynamic single longitude mode is still kept under high speed modulation (2.5 Gbit/s~10 Gbit/s), which is very suitable for the high speed short-distance fiber-optic communication system such as local area network (LAN). Currently, the commercial direct-modulated DFB semiconductor lasers are available for 2.5-Gbit/s over distances of up to a few hundred kilometers and the threshold current is about 5 mA. The 10 Gbit/s direct-modulated DFB semiconductor lasers are becoming the focus of research. For example, Japanese Corporation Mitsubishi in the year 2000 reported a direct-modulated DFB semiconductor laser that applied in 10 Gbit/s LAN. The operating wavelength of the laser was 1.3 µm and $\lambda/4$ phase-shifted DFB grating was used. By reducing the electrode area and the laser cavity length (cavity length is 200 m), the modulation bandwidth of the laser is enhanced. And high temperature performance is improved by increasing the index-coupling coefficient. In the range of 25° C.~70° C., the modulation bandwidth is larger than 10 GHz, and the transmission distance is more than 20 km using standard single mode fibers.

In DFB semiconductor lasers, the quality of the Bragg grating plays a very crucial role, which directly determines the quality and performance of the lasers. Besides the $\lambda/4$ phase-shifted grating, Bragg grating with complex structure also improves the performance of DFB semiconductor lasers [S. Nilsson, T. Kjellberg, T. Klinga, R. Schatz, J. Wallin, K. Streubel, "Improved spectral characteristics of MQW-DFB lasers by incorporation of multiple phase-shifts", J. Lightwave Technol. Vol. 13, pp. 434-441, March 1995; Nong Chen, Y. Nakano, K. Okamoto, K. Tada, G. I. Morthier, R. G. Baets, "Analysis, fabrication, and characterization of tunable DFB lasers with chirped gratings, IEEE Journal of Selected Topics in Quantum Electronics, vol. 3, pp. 541-546, April 1997]. In the fabrication processes of DFB lasers, grating writing is a difficult but important process. The quality of the DFB grating is the decisive factor in the devices' performance. If there are some errors in practical grating fabrication, they cannot be finely adjusted or corrected. Furthermore, non-uniform gratings with complicated structure cannot be achieved using relatively simple and low-cost holographic exposure, but can be fabricated by electron-beam lithography or other complex techniques. The λ/4 phase shifted Bragg grating is non-uniform, so λ/4 phase shifted DFB semiconductor laser bears the problems of high cost, low product yield and complicated manufacture.

The fabrication of complex Bragg grating on the semiconductor waveguide becomes a key technique in the manufacture of high-performance DFB semiconductor lasers. In year 2002, a sampled Bragg grating (SBG) with chirp in the sampling period (CSP) was proposed in the Chinese patent "the sampled Bragg grating for dispersion compensation and polarization model dispersion with novel sampling structure" to obtain the desired equivalent chirp in the grating period (CGP) (Chinese patent, CN02103383.8, Jia Feng, Xiangfei Chen, et. al, Year 2002). The earliest literature to introduce equivalent chirp was the paper by Xiangfei Chen et. al, "Analytical expression of sampled Bragg gratings with chirp in the sampling period and its application in dispersion management design in a WDM system", IEEE Photonics Technology Letters, 12, pp. 1013-1015, 2000. The characteristic feature of equivalent chirp technology is that the desired equivalent chirps can be obtained only using sub-micron precision. This special Bragg Grating is an SBG 502, which has many reflection peaks. As shown in FIG. 4, based on Fourier analysis, an SBG consists of multiple ghost gratings and each reflection peak corresponds to a ghost grating. The ghost gratings are characterized by Fourier orders ($0^{th}$, $+1/-1^{st}$, $+2/-2^{nd}$, $+3/-3^{rd}$, . . . ,). For example, the center reflection peak at the center Bragg wavelength 404 is related to the $0^{th}$ order ghost grating. The ghost grating is also described using the term channel. The $0^{th}$ ghost grating 404 can be described as $0^{th}$ channel. The two reflection peaks or channels 403 and 405 correspond to the $1^{st}$ order ghost grating and $-1^{st}$ order ghost grating, respectively. The $1^{st}$ order channel is located on the left (shorter wavelength) of the center Bragg wavelength and the $-1^{st}$ order channel is located on the right (longer wavelength). The $1^{st}$, $-1^{st}$ or other order ghost grating can do work similarly with a conventional Bragg grating. That is to say, within the working band, when the filtering characteristic of the ghost gratings is same as that of conventional Bragg gratings, the ghost grating is the "same" as the corresponding conventional Bragg grating. Therefore, we can use $1^{st}$ and $-1^{st}$ order ghost gratings 403 and 405 to replace conventional Bragg grating 302 as feedback element. Other order ghost gratings (Fourier orders=±2, ±3, . . . ,) can also be used to replace the conventional Bragg gratings. However, due to their low effective index coupling coefficients, the high-order (Fourier orders=±2, ±3, . . . ,) ghost gratings are usually neglected. The $0^{th}$ order ghost grating is also not usable because equivalent chirp cannot occur within. Then $1^{st}$ and $-1^{st}$ order ghost gratings are selected in practical applications for their larger effective index-coupling coefficients. No matter which order is chosen, only one ghost grating should be used to replace the conventional Bragg grating.

For convenience, such a ghost grating that is used to replace conventional Bragg grating is called equivalent grating. In operation band of ordinary grating, the equivalent grating can completely substitute the ordinary grating. The various functional capacities of equivalent grating are achieved by changing the distribution of sampling periods. For the reason that the sampling period is generally much larger than the grating period, the fabrication of the specific Bragg grating (equivalent grating) can be simplified greatly at a much lower cost. And all kinds of equivalent gratings with different optical response can be designed and fabricated easily without changing phase mask in the fabrication of fiber Bragg grating. For example, based on this technique, all kinds of complex equivalent chirps can be realized only using sub-micron precision, while such equivalent chirps perform almost identically with the true chirp in the grating period. Chirp in the grating means that the grating period is non-uniform, and the grating with chirp in the grating period is called chirped grating. The first order equivalent chirp, second order equivalent chirp and higher-order equivalent chirp may be achieved independently using equivalent chirp technology illustrated in the above.

Yitang Dai and Xiangfei Chen et al. have brought forward a novel concept of equivalent phase shift in the patent "the sampling fiber grating for en/decoding in DS-OCDMA system and its facture" (CN200410009546.X). The concept is also introduced in the paper of "Equivalent phase shift in a fiber Bragg grating achieved by changing the sampling period", IEEE Photon. Tech. Lett., vol. 16, pp. 2284-2286, 2004. Furthermore, a new kind of technique has been proposed to design and fabricate any physically feasible equivalent grating with desired filtering in the Chinese patent of "a kind of fiber grating used to realize arbitrary desired optical response" (CN200410007530.5). This technique is a new technique combining reconstruction algorithm and equivalent chirp methods, which is called "reconstruction-equivalent chirp (REC) technology. The detailed description of REC technology can also be referred to the paper "Sampled Bragg grating with desired response in one channel by use of a reconstruction algorithm and equivalent chirp", Opt. Lett., vol. 29, 1333-1335, 2004. The term "REC" was first brought up in the paper "Correction of the repeatable errors in the fabrication of sampled Bragg gratings", OFC'2005, OME20, 2005. With REC technology, all kinds of physically realizable equivalent gratings with desired filtering characteristics can be designed and fabricated using ordinary sub-micron precision setups. The equivalent gratings can replace conventional Bragg gratings because in their operation bandwidth, they have the same optical response. Namely, conventional Bragg grating with complex optical response can be replaced by the corresponding equivalent grating for the same optical response.

The conventional grating in DFB semiconductor laser can be replaced by equivalent grating. Such an equivalent grating can be designed and fabricated using equivalent chirp technology and equivalent phase shift technology. More complicated equivalent grating can be designed and fabricated using REC technology. It should be mentioned that equivalent chirp and equivalent phase shift technologies are the special cases of the REC technology.

Semiconductor lasers are manufactured on a laser diode wafer. Many semiconductor lasers can be integrated on a wafer. When using REC technology to fabricate DFB lasers, the laser wavelengths of the DFB semiconductor lasers in the wafer can be determined by the corresponding equivalent gratings, namely, by the Bragg wavelengths of the equivalent gratings. The Bragg wavelengths of equivalent gratings are determined by the sampling periods of the DFB grating structures. Thus, based on REC technology, the laser wavelengths can be controlled by adjusting the sampling period of every DFB semiconductor laser on the wafer. The laser wavelength can be changed by more than 60 nm on a laser diode wafer.

The performance of DFB semiconductor lasers also varies with the material that is used in the fabrication of the DFB lasers. Usually, materials for DFB semiconductor lasers are III-V, II-VI and IV-VI compound semiconductors and so on.

SUMMARY OF THE INVENTION

The object of the present invention is to provide a method by which the high-performance DFB semiconductor lasers with complex structures are manufactured using only ordinary holographic exposure and common sub-micron-precision semiconductor processes. Another objective of the invention is to use equivalent grating in the sampled Bragg grating (SBG) 502 designed and fabricated by equivalent chirp technology, equivalent phase shift technology and more extensively, reconstruction-equivalent chirp (REC) technology to replace the conventional Bragg gratings 302 in DFB lasers. It should be mentioned that equivalent chirp and equivalent phase shift technologies are the special cases of the REC technology.

The present invention is based on REC technology. To be exact, as shown in FIG. 5, the grating in the waveguide of the DFB semiconductor laser is a SBG 502, which has an equivalent grating corresponding to an ordinary Bragg grating 302 as feedback for lasing. The laser wavelength of the semiconductor laser located within the operation bandwidth of the equivalent grating. The equivalent grating is designed and fabricated using REC technology and has equivalent chirps, one equivalent phase shift or n equivalent phase shifts. Here, n usually is 2 to 5. The SBG has multiple ghost gratings and the wavelength spacing between neighboring ghost gratings is inversely proportional to the sampling period and the effective refractive index of the semiconductor laser. The sampling periods of the SBG in the said DFB semiconductor laser are usually less than 20 microns but bigger than or equal to 1 micron.

The equivalent grating in the laser is designed and fabricated by the equivalent phase shift technology. For example, within the +/−15% range around the center of SBG, there is a sudden change in one sample period, such a sampling period with change is 1.4 to 1.6 or 0.4 to 0.6 times of the original sampling period, while other sampling periods remain the same as before.

The DFB grating structure of the semiconductor laser is using laterally coupled DFB grating structure. As shown in FIG. 2, the SBG with equivalent grating structure 207 is located on both sides of the ridge waveguide and can be formed by only one epitaxial growth.

The equivalent grating is formed using the following processes. Firstly we design and fabricate a photomask corresponding to the equivalent grating. The sampling periods are between 1 to 20 microns and the duty cycles are between 0.4-0.6. And then the grating pattern can be produced by holographic exposure and photolithography using the photomask. The photolithography is used to produce sampling patterns in the wafer and holographic exposure is used to produce the elementary DFB grating structure.

The grating in the waveguide of the said special DFB semiconductor laser we invented is SBG, comprising of multiple ghost gratings. The sampling period is usually less than 20 microns. The effective refractive index of the said semiconductor laser waveguide is commonly between 3.1 and 3.7. If the sampling period and the effective refractive index are set to be 10 microns and 3.7, respectively, the wavelength spacing between the neighboring ghost gratings, which is inversely proportional to the sampling period and the effective refractive index of the semiconductor laser waveguide, is more than 30 nanometers. When the sampling period of the SBG in the said DFB laser is 4 micron and the effective refractive index is 3.3, the wavelength spacing between neighboring ghost gratings is about 91 nanometers. Thus, when the effective refractive index of the waveguide is constant, we can control the lasing wavelength by changing the sampling period.

Changing the sampling periods cannot change the filtering characteristics of the ghost gratings 404 related to the center Bragg wavelength corresponding to the $0^{th}$ Fourier order, which has the maximum effective index modulation. Generally the $+1^{st}$-order ghost grating 403 or $-1^{st}$-order ghost grating 405 is chosen as equivalent grating, for their refractive index modulation is the largest except the ghost grating related to the center Bragg wavelength. The wavelength spacing between the neighboring ghost gratings is important. If the gain of the semiconductor laser cannot change with the wavelength, the laser wavelengths in the SBG based semiconductor laser may occur in $0^{th}$ order ghost grating 404, $+1^{st}$ order ghost grating 403 or $-1^{st}$ order ghost grating 405 for these three ghost gratings have the highest index modulation and the lowest lasing threshold. However, actual gain of semiconductor lasers is changed with the wavelength, and it usually reaches the maximum around the laser wavelength. The gain will decrease quickly with the deviation from the laser wavelength. The typical value decreases to half of the maximum when the deviation is 20 nanometers. So when the sampling period of the SBG is 6 microns and the effective refractive index of the semiconductor laser waveguide is 3.3, the wavelength spacing between the neighboring ghost gratings is 60 nanometers. In such situations, only one laser mode can oscillate. The laser wavelength must be chosen within the bandwidth of the equivalent grating. When the laser wavelength is within the bandwidth of the $+1^{st}$ order ghost grating 403, that is to say, the equivalent grating is the $+1^{st}$ order ghost grating 403, the lasing thresholds of other ghost gratings (for example the $0^{th}$ order ghost grating 404 and $-1^{st}$ order ghost grating 405) are larger than that of the equivalent grating. Similarly, when the laser wavelength is within the bandwidth of the $-1^{st}$ order ghost grating 405, that is to say, the equivalent grating is the $-1^{st}$ order ghost grating 405, the lasing thresholds of other gratings (for example the $0^{th}$ order ghost grating 404 and $+1^{st}$ order ghost grating 403) are larger than that of the equivalent grating. Therefore generally for a DFB laser using REC technology, the lasing can only occur in the equivalent grating.

The quarter-wave phase-shift DFB semiconductor laser based on REC technology is using a SBG structure, wherein the sampling period at a certain position (usually at the center of the SBG) is changed suddenly. At the same time, the other sampling periods remain unchanged. Then some ghost gratings of the SBG can be realized in the same way as the true phase-shifted gratings. This kind of characteristic relative to phase shift is called equivalent phase shift. More widely, when sampling periods at multiple positions are changed, similarly, we can achieve multiple equivalent phase shifts in those ghost gratings. Especially when the sampling period in the center of the SBG increases or decreases by half and the other sampling periods remain the same, equivalent π-phase shift can be obtained at the odd order ghost gratings, resulting in an equivalent quarter-wave phase-shift DFB semiconductor laser. (see Dianjie Jiang, Xiangfei Chen et. al "A novel distributed feedback fiber laser based on equivalent phase shift, IEEE Photon. Tech. Lett", 16, 2598 (2004), and Xiangfei Chen et. Al "distribution feedback light waveguide laser", CN200410042789.3)

In the manufacture process of DFB semiconductor lasers, the epitaxial growth of materials is complex and expensive. In order to avoid manufacturing inner Bragg gratings to reduce the number of times of epitaxy, we can use the laterally coupled gratings. To make the grating fabrication easier, the present invention proposes that the DFB semiconductor lasers based on equivalent grating can use laterally coupled grating structure, where the grating is located on both the two sides of the ridge waveguide. This kind of DFB semiconductor laser only needs one epitaxial process.

To reduce the influence from the reflection of the facets and improve the power of the said DFB semiconductor laser, at least one facet of the two facets is provided with an anti-reflection coating whose reflection is between 0.001% to 10%.

A conventional DFB semiconductor laser consists of multiple layers. As shown in FIG. 1 these layers are grown on n-type substrate and from the bottom to top the layers are: n-type InP epitaxial buffer layer 102, undoped lattice match InGaAsP waveguide layer 103, InGaAsP strained multi-quantum well layer 104, InGaAsP grating layer 105, secondary epitaxial p-type lattice match InGaAsP waveguide layer 106, p-type InP confinement layer 107, ridge waveguide 108 and p-type Ohmic contact layer 109. The surface of the said DFB laser is 200-400 nm thick $SiO_2$ insulating layer, and $SiO_2$ film on the ridge is etched out to contact with the metal electrode. Both of the two facets of the device have antireflection coatings to limit the reflection within 1%. The present invention is related to a semiconductor laser based on REC technology. The REC based semiconductor lasers can be realized by replacing the grating in the InGaAsP grating layer 105 with a sampled Bragg grating with the equivalent grating for lasing.

A conventional laterally coupled DFB semiconductor laser also consists of multiple layers. As shown in FIG. 2 these layers are grown on n-type substrate and from the bottom to top the layers are: n-type InP epitaxial buffer layer 202, undoped lattice match InGaAsP waveguide layer 203, InGaAsP strained multi-quantum well layer 204, p-type lattice match InGaAsP waveguide layer 205, p-type InP confinement layer 206 and p-type Ohmic contact layer 209. The grating 207 is formed on the both sides of the ridge waveguide 208. The surface of the said DFB laser is 200-400 nm thick $SiO_2$ insulating layer, and $SiO_2$ film on the ridge is etched out to contact with the metal electrode. Both of the two facets of the device have antireflection coatings to limit the reflection within 1%. The present invention is related to a semiconductor laser based on REC technology. The REC based semiconductor lasers can be realized by replacing the grating 207 in the InGaAsP grating layer with a sampled Bragg grating with the equivalent grating for lasing.

In the present invention, the laser wavelength of the said REC technology based DFB semiconductor laser is determined by the center wavelength of the equivalent gratings. The center wavelength of the equivalent grating is changed with the sampling period of the SBG. When the effective refractive index of the semiconductor laser waveguide is 3.3, and the actual period of the grating in the wafer is constant while the sampling period is changed from 6 microns to 4 microns, the center wavelength of the equivalent gratings will change by about 30 nm. When the sampling period is changed from 6 microns to 3 microns, the center wavelength of the equivalent grating will change by about 60 nm. When the sample period is changed from 6 microns to 2 microns the center wavelength of the equivalent grating will change by about 100 nm. The feature of the present invention is that the lasing wavelengths of REC technology based DFB semiconductor lasers on one wafer can vary over a range of 60 nm.

The performance of DFB semiconductor lasers also varies with materials, which are used in fabrication of the lasers. Usually, materials for DFB semiconductor lasers are III-V, II-VI and IV-VI compound semiconductors and so on.

Figure 3:
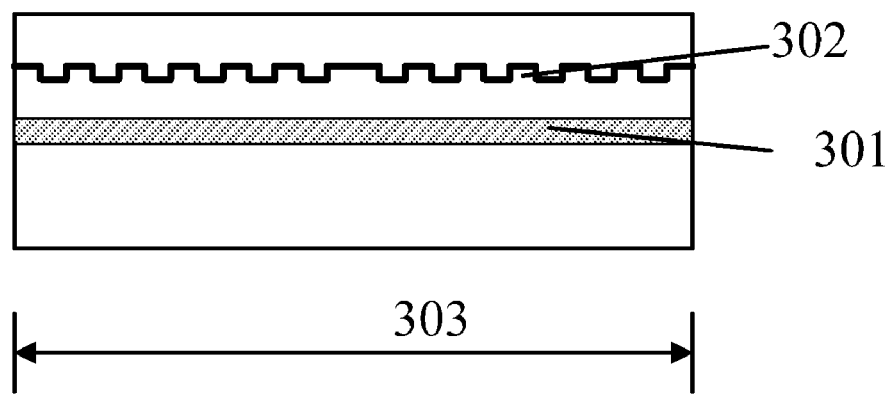

201. n-side electrode; 202, substrate and lower cladding layer; 203, lower waveguide layer; 204, multiple-quantum-well active layer; 205, upper waveguide layer; 206, upper cladding layer; 207, DFB grating; 208, waveguide; 109, ohmic contact layer; 110. p-side electrode;

FIG. 3 Schematic diagram of Bragg grating structure in a conventional DFB semiconductor laser.

301 active layer; 302 Bragg grating; 303 the length of the laser cavity

Figure 4:
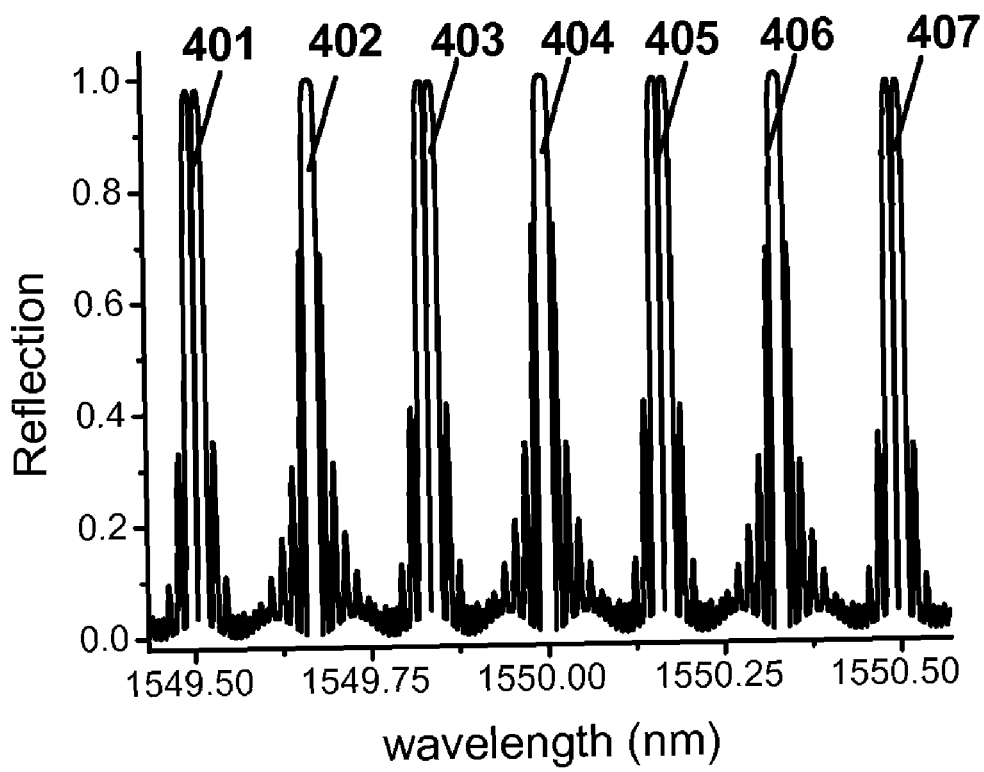
Figure 5:
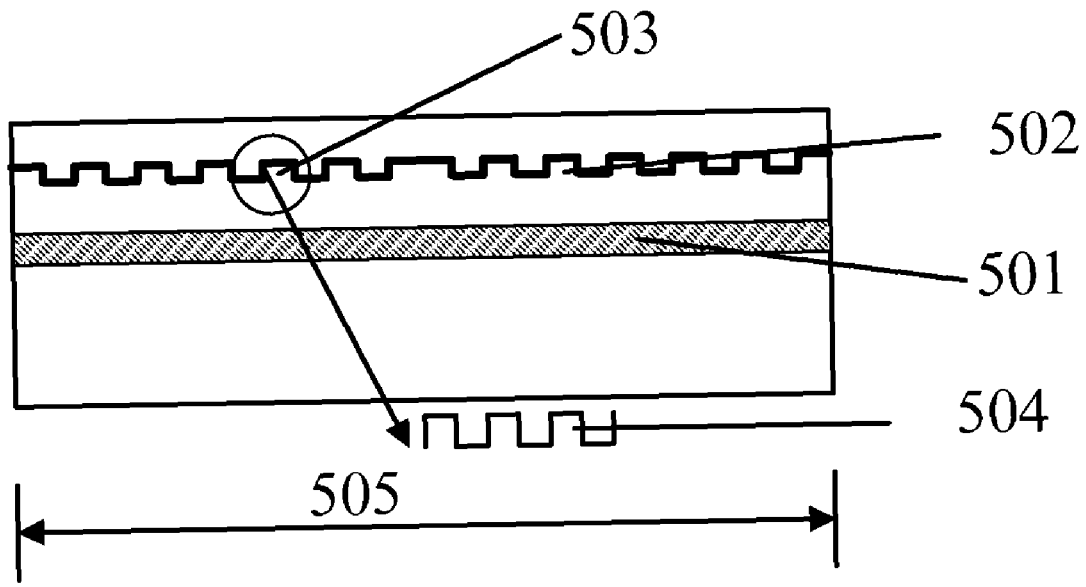

FIG. 4 Schematic spectrum of a sampled Bragg grating 401, 3rd order reflection peak related to 3rd order ghost grating; 402, 2nd order reflection peak related to 2nd order ghost grating; 403, 1st order reflection peak related to $1^{st}$ order ghost grating; 404, $0^{th}$ order reflection peak related to $0^{th}$ order ghost grating; 405, $-1^{st}$ order reflection peak related to $-1^{st}$ order ghost grating; 406, $-2^{nd}$ order reflection peak related to $-2^{nd}$ order ghost grating; 407, $-3^{rd}$ order reflection peak related to $-3^{rd}$ order ghost grating;

FIG. 5 Schematic diagram of the grating structure of an equivalent grating based DFB semiconductor laser.

501, active layer; 502, Sampled Bragg grating; 503, a sample in the sampled Bragg grating; 504, grating structure in a grating sample; 505, the length of laser cavity

DETAIL DESCRIPTION OF THE INVENTION

First embodiment: equivalent grating based DFB semiconductor laser working in 1550 nm window.

Figure 1:
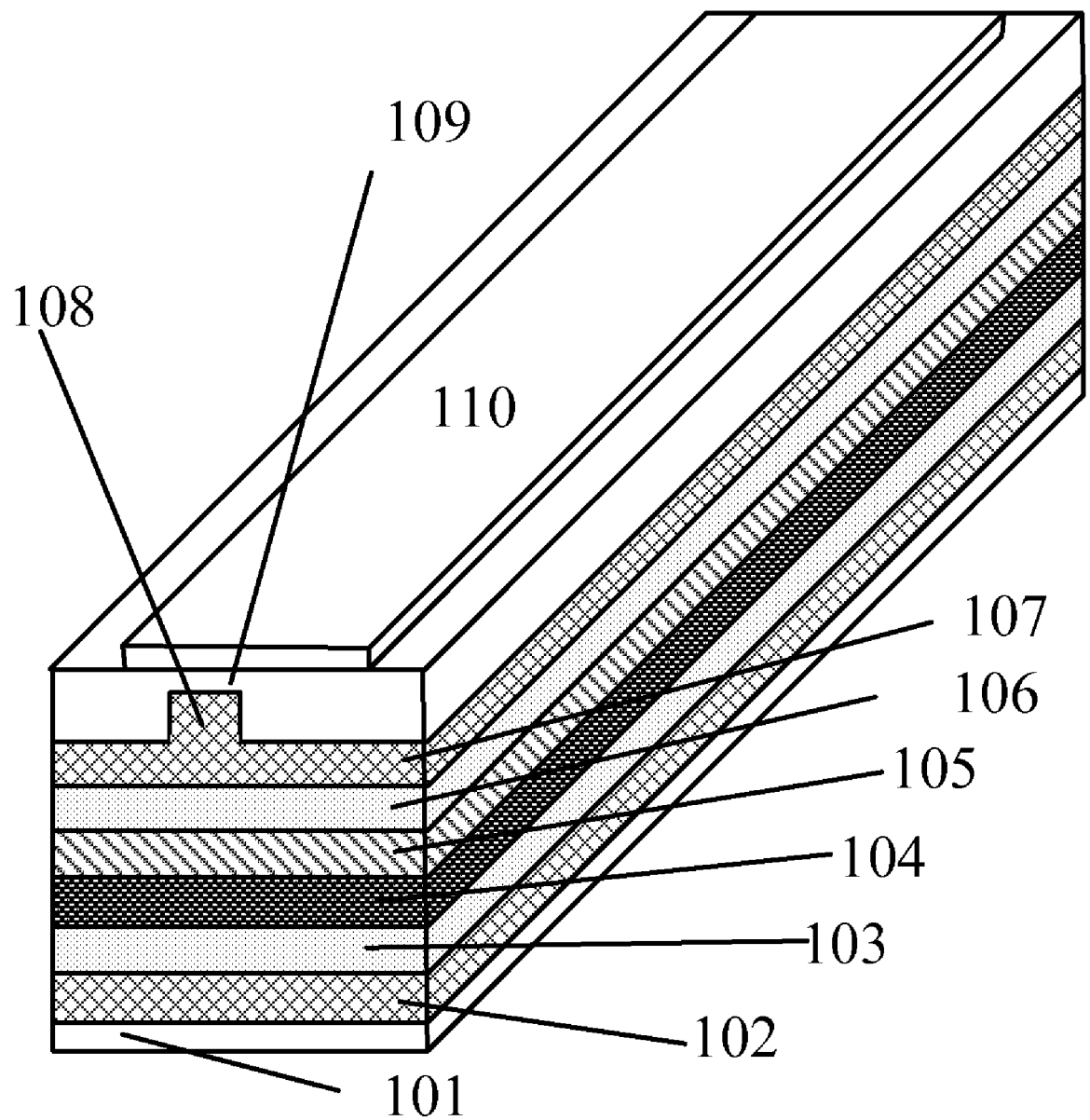
FIG. 1 the schematic diagram of a conventional DFB semiconductor laser 101, n-side electrode; 102, substrate and lower cladding layer; 103, lower waveguide layer; 104, multiple-quantum-well active layer; 105, DFB grating; 106, upper waveguide layer; 107, upper cladding layer; 108, ridge waveguide; 109, ohmic contact layer; 110. p-side electrode.

As shown in FIG. 1, the epitaxial processes are described in the following. For the first epitaxial growth, 200 nm n-type InP buffer layer, 100 nm undoped lattice-matched InGaAsP waveguide layer, strained InGaAsP multiple-quantum wells layer and 70 nm InGaAsP grating layer are successively grown on an n-type InP (100) substrate by MOVPE. The photomask containing sampling period pattern for fabrication of equivalent grating is manufactured using normal integrated circuit process. The sampling period of the sampled Bragg grating (SBG) pattern is 4 microns, and the duty cycle of each sample is 0.5. The sampling period in the center of the SBG pattern is changed discretely and is 2 microns. Other sampling periods keep the same as 4 microns. The sampled grating is then formed on the InGaAsP grating layer by a conventional holographic exposure combined with the conventional photolithography. After the fabrication of the sampled grating, 100 nm p-type lattice-match InGaAsP waveguide layer, 1700 nm p-type InP confine layer and 100 nm p-type InGaAs Ohm contact layer are grown over the entire structure in the second epitaxial growth step. Then a conventional ridge waveguide processing is performed and a $SiO_2$ layer is deposited by plasma-enhanced chemical vapor deposition (PECVD) to enclose the ridge. The ridge waveguide is 400-micron long and 3-micron wide, and the buried two sides of the ridge are 20 microns wide and 1.5 microns deep. The surface on the DFB laser contains 300 nm $SiO_2$ insulating layer. $SiO_2$ film on the ridge was etched out to make the laser surface contact with metal electrode. Both two facets of the laser device have anti-reflection coating with reflectivity less than 1%. The typical laser threshold current is 16 mA, and side mode suppression ratio is larger than 40 dB.

Second embodiment: laterally coupled equivalent grating based DFB semiconductor laser working in 1550 nm window.

Figure 2:
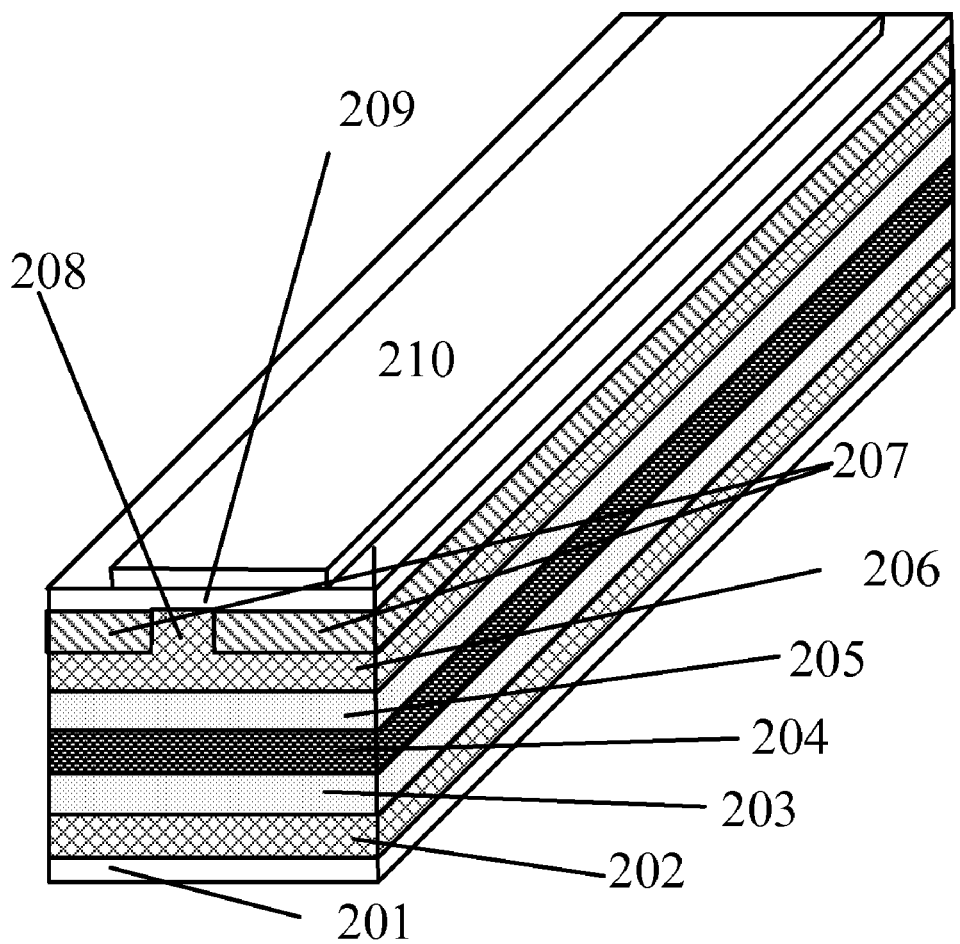
FIG. 2 the schematic diagram of a conventional laterally coupled DFB semiconductor laser.

As shown in FIG. 2, the epitaxial processes are described in the following. For epitaxial growth, 200 nm n-type InP buffer layer, 100 nm undoped lattice-matched InGaAsP waveguide layer, strained InGaAsP multiple-quantum wells layer, 100 nm p-type lattice-match InGaAsP waveguide layer, 1700 nm p-type InP confine layer and 100 nm p-type InGaAs Ohm contact layer are successively grown on an n-type InP (100) substrate by MOVPE. A conventional ridge waveguide processing is performed and a SiO$_2$ layer is deposited by plasma-enhanced chemical vapor deposition (PECVD) to enclose the ridge. The ridge waveguide has 400-micron long and 3-micron wide. The photomask containing sampling period pattern for fabrication of equivalent grating is manufactured using normal integrated circuit process. The sampling period of the sampled Bragg grating (SBG) pattern is 4 microns, and the duty cycle of each sample is 0.5. The sampling period in the center of the SBG pattern is changed discretely and is 2 microns. Other sampling periods keep the same as 4 microns. Using the photomask containing SBG pattern, the sampled grating is then formed on the two sides of the ridge by a conventional holographic exposure combined with the conventional photolithography. The surface on the DFB laser contains 300 nm SiO$_2$ insulating layer. SiO$_2$ film on the ridge was etched out to make the laser surface contact with metal electrode. Both two facets of the laser device have anti-reflection coating with reflectivity less than 1%. The typical laser threshold current is 27 mA, and side mode suppression ratio is larger than 40 dB.

What is claimed is:

1. A manufacture method of distributed feedback (DFB) semiconductor laser device, wherein a Bragg grating in the DFB semiconductor laser cavity is not an ordinary DFB grating but a sampled Bragg grating, in the sampled Bragg grating, there is an equivalent grating corresponding to the original ordinary DFB grating as feedback for lasing, the lasing wavelength of the DFB semiconductor laser is fallen within a forbidden band of the equivalent grating, thereby the equivalent grating is designed and fabricated by reconstruction-equivalent-chirp (REC) technology, and chirps and phase shifts in the equivalent grating are designed and fabricated using equivalent-chirp and equivalent-phase- shift methods, namely, the equivalent grating has one equivalent phase shift or multiple equivalent phase shifts and equivalent chirps, the sampled Bragg grating has multiple ghost gratings and the wavelength spacing between neighboring ghost gratings is inversely proportional to the sampling period and the effective refractive index of the semiconductor laser, only one ghost grating except the ghost grating related to the center wavelength is selected to be as equivalent grating.

2. The manufacture method of distributed feedback (DFB) semiconductor laser device according to claim 1, wherein the DFB grating structure is a laterally coupled DFB grating structure, the laterally coupled grating is located on the both sides of a laser ridge waveguide.

3. The manufacture method of distributed feedback (DFB) semiconductor laser device based according to claim 1, wherein within a ±15% range around the center of the sampled Bragg grating in a laser cavity, a sampling period is discretely changed, which is 1.4-1.6 or 0.4-0.6 times of the original sampling period, other sampling periods are kept unchanged.

4. The manufacture method of distributed feedback (DFB) semiconductor laser device according to claim 2, wherein within a ±15% range around the center of the sampled Bragg grating in the laser cavity, a sampling period is discretely changed, which is 1.4-1.6 or 0.4-0.6 times of the original sampling period, other sampling periods are kept unchanged.

5. The manufacture method of distributed feedback (DFB) semiconductor laser device according to claim 1, wherein the sampled Bragg grating in the laser device is fabricated by the following steps: in the first step, a photomask corresponding to the equivalent grating is fabricated, the sampling period in a photomask is between 1 to 20 microns and a duty cycle in each sample is between 0.4 and 0.6; in the second step, the sampled Bragg grating structure is formed by holographic exposure and lithography through the photomask containing sampling pattern.

6. The manufacture method of distributed feedback (DFB) semiconductor laser device according to claim 2, wherein the sampled Bragg grating in the laser device is fabricated by the following steps, in first step, a photomask corresponding to the equivalent grating is fabricated, the sampling period in the photomask is between 1 to 20 microns and the duty cycle in each sample is between 0.4 and 0.6; in second step, the sampled Bragg grating structure is formed by holographic exposure and lithography through the photomask containing sampling pattern.

7. The manufacture method of distributed feedback (DFB) semiconductor laser device according to claim 3, wherein the sampled Bragg grating in the laser device is fabricated by the following steps: in the first step, a photomask corresponding to the equivalent grating is fabricated, the sampling period in the photomask is between 1 to 20 microns and the duty cycle in each sample is between 0.4 and 0.6; in the second step, the sampled Bragg grating structure is formed by the holographic exposure and lithography through the photomask containing sampling pattern.

8. The manufacture method of distributed feedback (DFB) semiconductor laser device according to claim 1, wherein the sampling period of the sampled Bragg grating involved in the DFB semiconductor laser is less than 20 microns and larger than or equal to 1 micron.

9. The manufacture method of distributed feedback (DFB) semiconductor laser device according to claim 2, wherein the sampling period of the sampled Bragg grating involved in the DFB semiconductor laser is less than 20 microns and larger than or equal to 1 micron.

10. The manufacture method of distributed feedback (DFB) semiconductor laser device according to claims 3, wherein the sampling period of the sampled Bragg grating involved in the DFB semiconductor laser is less than 20 microns and larger than or equal to 1 micron.

11. The manufacture method of distributed feedback (DFB) semiconductor laser device according to claim 4, wherein the sampling period of the sampled Bragg grating involved in the DFB semiconductor laser is less than 20 microns and larger than or equal to 1 micron.

12. The manufacture method of distributed feedback (DFB) semiconductor laser device according to claim 5, wherein the sampling period of the sampled Bragg grating involved in the DFB semiconductor laser is less than 20 microns and larger than or equal to 1 micron.

13. The manufacture method of distributed feedback (DFB) semiconductor laser device according to claim 6, wherein the sampling period of the sampled Bragg grating involved in the DFB semiconductor laser is less than 20 microns and larger than or equal to 1 micron.

14. The manufacture method of distributed feedback (DFB) semiconductor laser device according to claim 7, wherein the sampling period of the sampled Bragg grating involved in the DFB semiconductor laser is less than 20 microns and larger than or equal to 1 micron.

15. The manufacture method of distributed feedback (DFB) semiconductor laser device according to claim 1, wherein the laser wavelengths in different lasers in a chip are different, every laser wavelength is determined by the center wavelength of the corresponding equivalent grating in sampled Bragg grating of the said laser, namely, the laser wavelength is determined by the sampling period of the sampled Bragg grating.

16. The manufacture method of distributed feedback (DFB) semiconductor laser device according to claim 2, wherein the laser wavelengths in different lasers in a chip are different, every laser wavelength is determined by the center wavelength of the corresponding equivalent grating in sampled Bragg grating of the said laser, namely, the laser wavelength is determined by the sampling period of the sampled Bragg grating.

17. The manufacture method of distributed feedback (DFB) semiconductor laser device according to claim 3, wherein the laser wavelengths in different lasers in a chip are different, every laser wavelength is determined by the center wavelength of the corresponding equivalent grating in sampled Bragg grating of the said laser, namely, the laser wavelength is determined by the sampling period of the sampled Bragg grating.

18. The manufacture method of distributed feedback (DFB) semiconductor laser device according to claim 4, wherein the laser wavelengths in different lasers in a chip are different, every laser wavelength is determined by the center wavelength of the corresponding equivalent grating in sampled Bragg grating of the said laser, namely, the laser wavelength is determined by the sampling period of the sampled Bragg grating.

* * * * *